US010848126B2

(12) United States Patent
Alicioglu et al.

(10) Patent No.: US 10,848,126 B2
(45) Date of Patent: Nov. 24, 2020

(54) BAND PASS FILTER HAVING PARALLEL CONNECTED NOTCH FILTER CIRCUITS

(71) Applicant: Avago Technologies International Sales Pte. Limited, Singapore (SG)

(72) Inventors: Bulent Alicioglu, Muenchen Deustchland (DE); Hongya Xu, Munich (DE); Martin Handtmann, Riemerling (DE); Lueder Elbrecht, Munich (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 45 days.

(21) Appl. No.: 16/174,345

(22) Filed: Oct. 30, 2018

(65) Prior Publication Data
US 2020/0136588 A1  Apr. 30, 2020

(51) Int. Cl.
H03H 9/54 (2006.01)
H03H 7/19 (2006.01)
H03H 7/38 (2006.01)
H03H 9/64 (2006.01)
H04B 1/40 (2015.01)

(52) U.S. Cl.
CPC .............. *H03H 9/547* (2013.01); *H03H 7/19* (2013.01); *H03H 7/38* (2013.01); *H03H 9/6409* (2013.01); *H04B 1/40* (2013.01)

(58) Field of Classification Search
CPC ........ H03H 9/547; H03H 9/6409; H03H 7/19; H03H 7/38; H04B 1/40
See application file for complete search history.

(56) References Cited

U.S. PATENT DOCUMENTS

| 6,020,783 | A | 2/2000 | Coppola | |
|---|---|---|---|---|
| 9,819,384 | B2 | 11/2017 | Xu et al. | |
| 2003/0042995 | A1* | 3/2003 | Ella | H03H 9/6426 333/133 |
| 2010/0150075 | A1* | 6/2010 | Inoue | H03H 9/0576 370/328 |
| 2011/0169589 | A1* | 7/2011 | Franzon | H01P 1/20 333/134 |
| 2014/0113571 | A1* | 4/2014 | Fujiwara | H03H 9/6433 455/73 |
| 2016/0028420 | A1* | 1/2016 | Srirattana | H04B 1/40 455/127.2 |
| 2016/0119017 | A1* | 4/2016 | Xu | H04B 1/48 455/79 |
| 2020/0153412 | A1* | 5/2020 | Nosaka | H03H 9/68 |

* cited by examiner

*Primary Examiner* — Samuel S Outten
(74) *Attorney, Agent, or Firm* — Foley & Lardner LLP

(57) ABSTRACT

A filter device provides a wideband passband of a communication device for a RF signal. The filter device includes a first filter circuit in parallel with a second filter circuit. The first filter circuit includes a first notch filter, and has a first notch. The second filter circuit includes a second notch filter in series with a reversal circuit for phase shifting the RF signal filtered by the second notch filter, the second filter circuit having a second notch. The first and second filter circuits form a band pass filter having a passband between a lower cutoff frequency defined by the second notch and an upper cutoff frequency defined by the first notch. The band pass filter provides low insertion loss in the passband, and high insertion loss in an adjacent lower stopband below the lower cutoff frequency and in an adjacent upper stopband above the upper cutoff frequency.

20 Claims, 5 Drawing Sheets

BAND PASS FILTER HAVING PARALLEL CONNECTED NOTCH FILTER CIRCUITS

BACKGROUND

Many mobile communication devices, such as cellular telephones, are configured to communicate over multiple wireless networks. Such mobile communication devices therefore include transmitters, receivers and corresponding filters in multiplexers, connecting the receivers and transmitters to a common antenna, for sending and receiving signals (e.g., radio frequency (RF) signals) over various wireless networks. The multiplexer interfaces between the antenna and each of the networks to enable transmitting signals on different transmit (uplink) frequencies and receiving signals on different receive (downlink) frequencies.

The filters associated with the multiplexer may include band pass filters, which provide passbands for passing various transmitted and received RF signals at the frequency bands corresponding to the passbands. Ideally, band pass filters block RF signals at frequencies outside the passbands. However, band pass filters may have passbands that extend into portions of other frequency bands, or may not provide sufficient margins between lower and upper cutoff frequencies of the desired passbands and neighboring frequency bands to prevent interference.

Conventional communications systems, including mobile communication devices, typically operate at frequencies below 3 GHz. However, because the spectrum below 3 GHz is almost fully allocated, communication systems have expanded into newly enabled fifth generation (5G) frequency bands, which have frequency bands above 3 GHz. FIG. 1 is a chart depicting examples of 5G frequency bands above 3 GHz and less than 6 GHz. The frequency bands are crowded in this range due to extensive use, which may result in interference between neighboring frequency bands to the extent that band pass filters used to isolate corresponding frequency bands may extend into other frequency bands and/or fail to sufficiently attenuate RF signals in adjacent frequency bands. Referring to FIG. 1, band n77 operates from 3.3 GHz to 4.2 GHz, band n78 operates from 3.3 GHz to 3.8 GHz, and band n79 operates from 4.4 GHz to 5.0 GHz, for example. FIG. 1 further shows Industrial, Scientific, and Medical (ISM) band for 5 GHz Wifi, which operates in various ranges between 5.18 GHz and 5.825 GHz, for example.

Communications systems operating in the 5G frequency band must be designed to withstand interference from other communications systems, as well as RF devices, such as microwave ovens, that operate outside traditional telecommunication frequency ranges (e.g., below 3 GHz) and that generate electromagnetic interference (EMI). As can be seen in FIG. 1, the frequency separation of newly defined frequency bands is typically narrow, in an attempt to maximize available bandwidth. The narrow separation between frequency bands requires that the filtering with high bandwidth must have precise lower and upper frequency cutoffs, and steep roll-off between the low insertion loss in the respective passband and high rejection at the adjacent bands.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
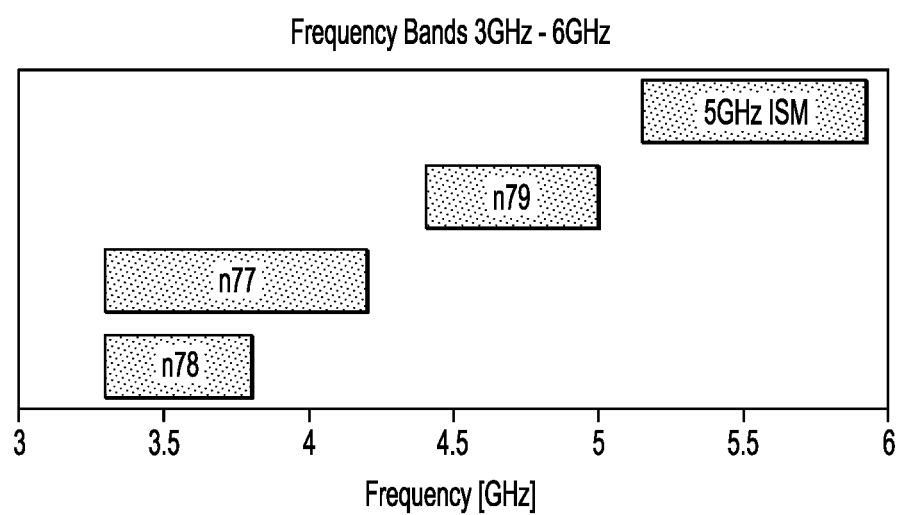
FIG. 1 is a chart depicting illustrative 5G frequency bands between 3 GHz and 6 GHz.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Generally, according to various embodiments, a filter device provides a wideband passband of a communication device for a radio frequency (RF) signal, e.g., having a frequency greater than 3 GHz. The filter device includes a first filter circuit and a second filter circuit connected in parallel with the first filter circuit. The first filter circuit includes a first notch filter, and provides a first notch. The second filter circuit includes a second notch filter and a reversal circuit, which is connected in series with the second notch filter, for phase shifting the RF signal filtered by the second notch filter, where the second filter circuit provides a second notch. The first filter circuit and the second filter circuit form a band pass filter having a passband between a lower cutoff frequency defined by the second notch and an upper cutoff frequency defined by the first notch, with steep roll-offs at the lower and upper cutoff frequencies. The band pass filter provides low insertion loss (e.g., less than about −1.5 dB) in the passband, high insertion loss (e.g., more than about −10 dB) in an adjacent lower stopband below the lower cutoff frequency of the passband, and high insertion loss in an adjacent upper stopband above the upper cutoff frequency of the passband.

Figure 2:
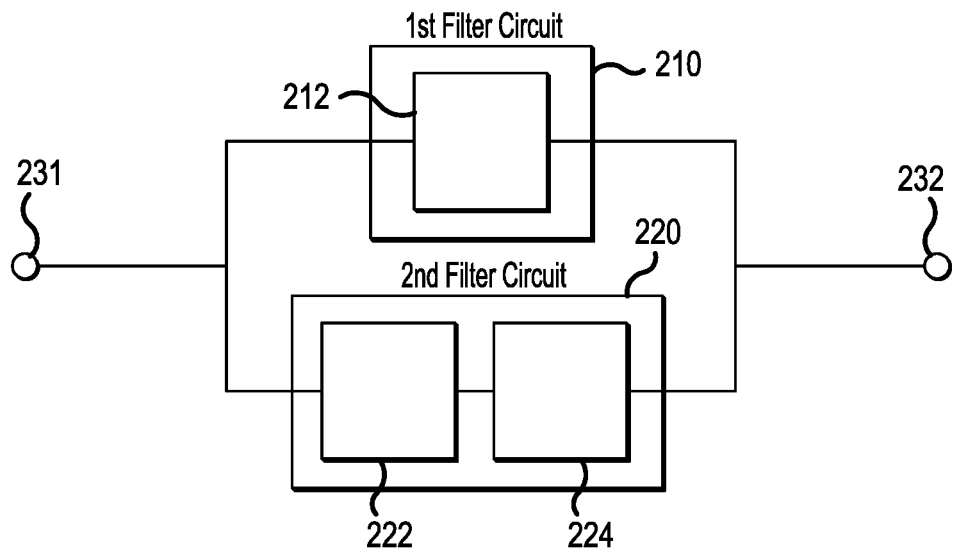
FIG. 2 is a simplified block diagram of a band pass filter device including notch filters and a phase shifter, according to a representative embodiment.

FIG. 2 is a simplified block diagram of a band pass filter device including notch filters and a phase shifter, according to a representative embodiment.

Referring to FIG. 2, a band pass filter 200 is a wideband filter for filtering a radio frequency (RF) signal having an operating frequency greater than about 3 GHz and a bandwidth greater than about 900 MHz, for example, although other operating frequencies and bandwidths may be accommodated, without departing from the scope of the present teachings. Generally, the embodiments may apply to filters having greater than about 25 percent bandwidth. The band pass filter 200 includes a first filter circuit 210 connected in parallel with a second filter circuit 220. The parallel connected first and second filter circuits 210 and 220 are connected between a first node 231 and a second node 232, one of which may be a common antenna node and the other may be a network node, for example, connecting to any of a variety of telecommunication networks, such as n77, n78, n79 and/or 5 GHz ISM.

The first filter circuit 210 includes a first notch filter 212. The first notch filter 212 has a filter response that provides a first notch (or first stopband), where the RF signal is attenuated (stop condition) at the frequency of the first notch. The first notch filter 212 may be implemented by any filter circuit configured to provide a first notch at the desired frequency, such as an acoustic resonator, a series inductor/capacitor (LC) resonator circuit, a series LC circuit or an open transmission line to a transmission tap, for example, although other types of filter circuits may be incorporated without departing from the scope of the present teachings. Examples of acoustic resonators include surface acoustic wave (SAW) resonators and bulk acoustic wave (BAW) resonators, such as film bulk acoustic resonators (FBARs) and solid mounted resonators (SMRs).

The second filter circuit 220, which may be referred to as a phase shifting filter circuit, includes a second notch filter 222 and a phase shifter 224 connected in series. The second notch filter 222 has a filter response that provides a second notch (or second stopband), where the RF signal is attenuated (stop condition) at the frequency of the second notch. As discussed above with regard to the first notch filter 212, the second notch filter 222 may be implemented by any filter circuit configured to provide a second notch at the desired frequency, such as an acoustic resonator, a series LC resonator circuit, a series LC circuit or an open transmission line to a transmission tap, for example, although other types of filter circuits may be incorporated without departing from the scope of the present teachings. The phase shifter 224 is configured to shift phase of the filtered RF signal about 180 degrees to provide a reversed phase of the second filter circuit 220. Shifting the phase by about 180 degrees inverts the second notch to provide a narrow band bandpass filter at the same frequency, such that the second filter circuit 220 provides a second (inverted) notch, or narrow passband, at the frequency of the second notch of the second notch filter 222. The phase shifter 224 may be implemented by any phase shifting circuit configured to substantially reverse phase of the output from the second notch filter 222, such as an LC circuit or a transmission line, connected in series with the second notch filter 222.

The frequency of the first notch of the first notch filter 212 corresponds to an upper cutoff frequency of the passband of the band pass filter 200. The frequency of the second notch of the second notch filter 222 corresponds to a lower cutoff frequency of the passband of the band pass filter 200. Thus, the first notch and the inverted second notch form the passband of the band pass filter 200.

Accordingly, the passband of the band pass filter 200 is formed between the lower cutoff frequency defined by the inverted second notch and the upper cutoff frequency defined by the first notch, where the passband has steep roll-offs at the lower and upper cutoff frequencies. Low insertion loss (e.g., less than about −1.5 dB) is provided within the passband, allowing the corresponding frequencies of the RF signal to pass through with little attenuation. However, outside the passband, high insertion loss (e.g., greater than about −10 dB) is provided at an adjacent lower stopband below the lower cutoff frequency of the passband and at an adjacent upper stopband above the upper cutoff frequency of the passband. For example, the band pass filter 200 may have an adjacent upper stopband extending at least 1 GHz or wider with respect to the upper cutoff frequency and an adjacent lower stopband extending at least 1 GHz or wider with respect to the lower cutoff frequency of the passband. The adjacent passbands are intended to be large enough to prevent portions of the RF signal outside the passband from interfering with RF signals in neighboring frequency bands.

Figure 3A:
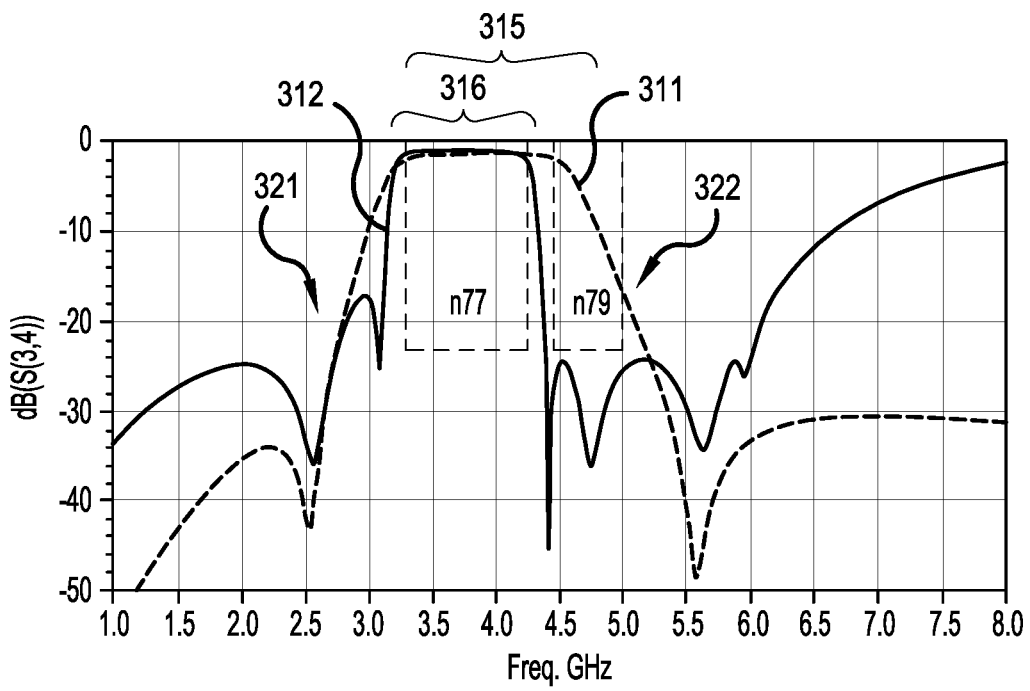
FIG. 3A is a graph showing insertion loss of a conventional bandpass filter and of a bandpass filter, according to a representative embodiment, for purposes of comparison.
Figure 3B:
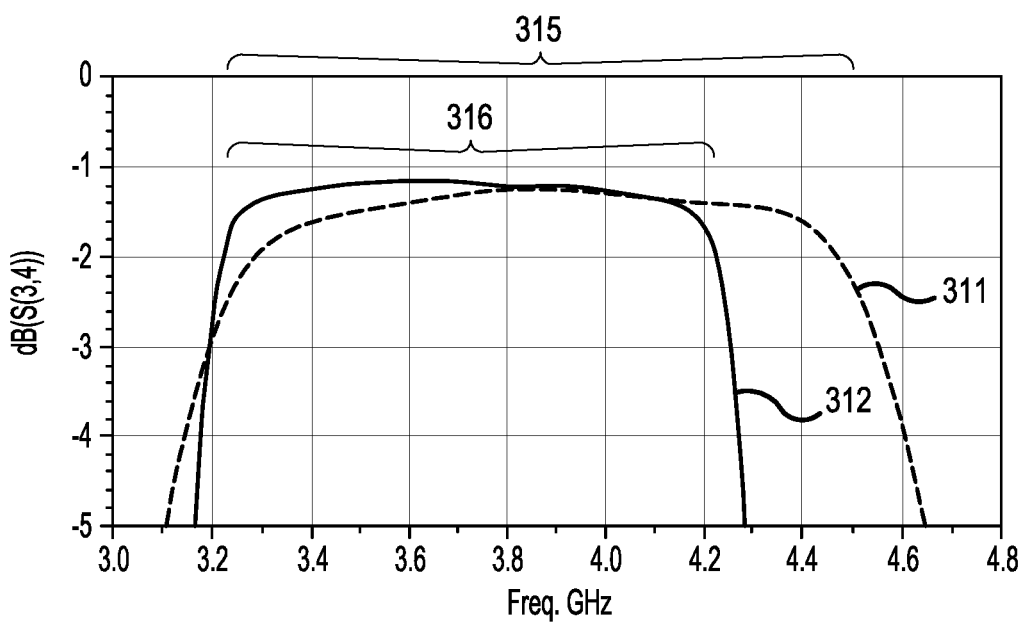
FIG. 3B is a graph showing a zoomed-in portion of the graph of in FIG. 3A, showing passbands above −5 dB of the conventional bandpass filter and of the bandpass filter, according to a representative embodiment, for purposes of comparison.

FIG. 3A is a graph showing insertion loss of a conventional bandpass filter and of a bandpass filter, such as the band pass filter 200, according to a representative embodiment, for purposes of comparison. FIG. 3B is a graph showing a zoomed-in portion of the graph of in FIG. 3A, showing passbands above −5 dB (e.g., effectively providing low insertion loss) of the conventional bandpass filter and of the bandpass filter, according to a representative embodiment.

In FIG. 3A, the graph indicates locations of band n77 (3.3 GHz-4.3 GHz) and band n79 (4.4 GHz-5.0 GHz) in dashed blocks, for purposes of illustration. Trace 311 (dashed line) shows the insertion loss in decibels (dB) of a conventional band pass filter, for example, for filtering signals in band n77. As shown in FIGS. 3A and 3B, the passband 315 of the conventional band pass filter extends beyond band n77 into neighboring band n79, which is undesirable, particularly above −5 dB. Other types of networks and/or other frequency bands may be incorporated without departing from the scope of the present teachings.

In comparison, trace 312 (solid line) shows the insertion loss of a bandpass filter (e.g., band pass filter 200), in accordance with a representative embodiment, for filtering signals in band n77. As shown in FIGS. 3A and 3B, due to the presence of the phase shifting filter circuit (e.g., second filter circuit 220), the passband 316 of the band pass filter (200) has very steep roll-offs at the lower cutoff frequency (e.g., about 3.2 GHz) and the upper cutoff frequency (about 4.2 GHz). This steep roll-off enables the passband 316 to incorporate the entire bandwidth of band n77, while avoiding frequencies of band n79 in areas of low attention. Also, the trace 312 shows that the insertion loss in the passband is low and fairly constant (between about −1.1 dB and about −1.5 dB), which is better than the insertion loss for the conventional band pass filter. In addition, the trace 312 shows high insertion loss (high signal attenuation) provided at frequencies below the lower cutoff frequency of the passband 316 in an adjacent lower stopband 321 (e.g., including frequencies below about 3.2 GHz). Likewise, the trace 312 shows high insertion loss (high signal attenuation) provided at frequencies above the upper cutoff frequency of the passband 316 in an adjacent upper stopband 322 (e.g., including frequencies above about 4.2 GHz). In the adjacent lower stopband 321, the insertion loss is less than −10 dB (in fact, less than about −18 dB). In the adjacent upper stopband 322, the insertion loss is less than about −10 dB, until about 6.5 GHz, which is a sufficient margin from the upper cutoff frequency of the passband 316 to assure prevention of interference from other frequency bands, such as 5 GHz ISM, for example.

Figure 4:
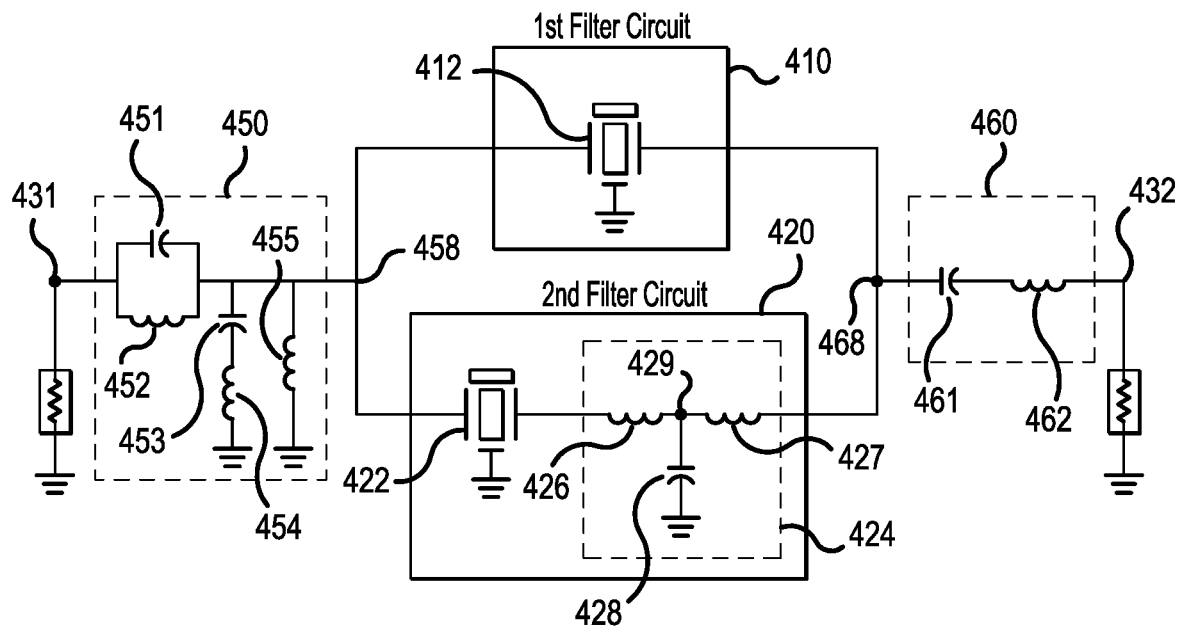
FIG. 4 is a simplified circuit diagram of a band pass filter device including notch filters and a phase shifter, according to a representative embodiment.

FIG. 4 is a simplified circuit diagram of a band pass filter device including notch filters and a phase shifter, according to a representative embodiment.

Referring to FIG. 4, a band pass filter 400 is a wideband filter for filtering a RF signal having an operating frequency greater than about 3 GHz and a bandwidth greater than about 25 percent with respect to center frequency. The band pass filter 400 includes a first filter circuit 410 connected in parallel with a second filter circuit 420. The parallel connected first and second filter circuits 410 and 420 are connected between a first node 431 and a second node 432, one of which may be a common antenna node and the other may be a network node, for example, connecting to any of a variety of telecommunication networks, such as band n77, band n78, band n79 and/or band 5 GHz ISM. The band pass filter 400 further includes an illustrative first matching network 450 for matching impedance with the first node 431, and an illustrative second matching network 460 for matching impedance with the second node 432.

In the depicted embodiment, the first filter circuit 410 includes a first notch filter implemented by a first resonator 412. The first resonator 412 is shown as a FBAR, although other types of resonators, such as another type BAW resonator (e.g., including a SMR), a SAW resonator, or a series LC resonator, may be incorporated without departing from the scope of the present teachings. As mentioned above, the first resonator 412 acts as the first notch filter, where a first series resonance frequency of the first resonator 412 corresponds to a first notch of the filter response. As discussed above, the RF signal is attenuated (stop condition) at the frequency of the first notch.

The second filter circuit 420, which may be referred to as a phase shifting filter circuit, includes a second notch filter implemented by a second resonator 422, and a phase shifter 424 connected in series with the second resonator 422. The second resonator 422 is likewise shown as an FBAR, although other types of resonators, such as a BAW resonator (e.g., including a SMR), a SAW resonator, or a series LC resonator, may be incorporated without departing from the scope of the present teachings. As mentioned above, the second resonator 422 acts as the second notch filter, where a second series resonance frequency of the second resonator 422 corresponds to a second notch of the filter response. The RF signal is attenuated (stop condition) at the frequency of the second notch.

The phase shifter 424 is configured to shift phase of the filtered RF signal about 180 degrees to provide a reversed phase of the second filter circuit 420. Shifting the phase by about 180 degrees inverts the second notch to provide a narrow band bandpass filter at the same frequency. In the depicted embodiment, the phase shifter 424 is an LC circuit including two inductances 426 and 427 in series with the second resonator 422, and a capacitance 428 connected between node 429 between the inductances 426 and 427 and ground voltage. Of course, other types of phase shifting circuits, such as other configurations of LC circuits or a transmission line, may be incorporated without departing from the scope of the present teachings.

The first series resonance frequency of the first resonator 412 (the first notch filter) corresponds to an upper cutoff frequency of the passband of the band pass filter 400. The second series resonance frequency of the second resonator 422 (the second notch) corresponds to a lower cutoff frequency of the passband of the band pass filter 400. Thus, the first notch provided by the first resonator 412 and the inverted second notch provided by the second resonator 422 form the passband of the band pass filter 400.

Accordingly, the passband of the band pass filter 400 is formed between the lower cutoff frequency defined by the inverted second notch and the upper cutoff frequency defined by the first notch, where the passband has steep roll-offs at the lower and upper cutoff frequencies. Low insertion loss (e.g., less than about −1.5 dB) is provided within the passband, allowing the corresponding frequencies of the RF signal to pass through with little attenuation. However, outside the passband, high insertion loss (e.g., greater than about −20 dB) is provided at an adjacent lower stopband below the lower cutoff frequency of the passband and at an adjacent upper stopband above the upper cutoff frequency of the passband.

More particularly, at frequencies below the second series resonance frequency of the second resonator 422, filter response of the first filter circuit 410 (first resonator 412) adds with a response of the reversed phase of the second filter circuit 420, forming the adjacent lower stopband of the band pass filter 400 below the second series resonance frequency of the second resonator 422 (the lower cutoff frequency). At frequencies between the second series resonance frequency of the second resonator 422 and a first series resonance frequency of the first resonator 412, the filter response of the first notch filter (first resonator 412) adds with a filter response of the second notch filter (second resonator 422), forming the passband of the band pass filter 400. At frequencies above the first series resonance frequency of the first resonator 412, the filter response of the first filter circuit 410 adds with the response of the reversed phase of the second filter circuit 420, forming the adjacent upper stopband of the band pass filter 400 above the first series resonance frequency of the first resonator 412 (the upper cutoff frequency).

In the depicted illustrative, non-limiting configuration, the first matching network 450 includes a first capacitance 451 connected in parallel with a first inductance 452, the parallel circuit being connected between the first node 431 and a first filter node 458. Also, a series connection of a second capacitance 453 and a second inductance 454 is connected between the first filter node 458 and ground voltage, and a third inductance 455 is connected between the first filter node 458 and ground voltage. The second matching network 460 includes a first capacitance 461 and a first inductance 462 connected in series between the second node 432 and a second filter node 468. Of course, the configurations of the first and second matching networks 450 and 560, as well as the corresponding capacitance and inductance values, may vary to provide unique benefits for any particular situation or to meet application specific design requirements of various implementations, as would be apparent to one skilled in the art.

Figure 5:
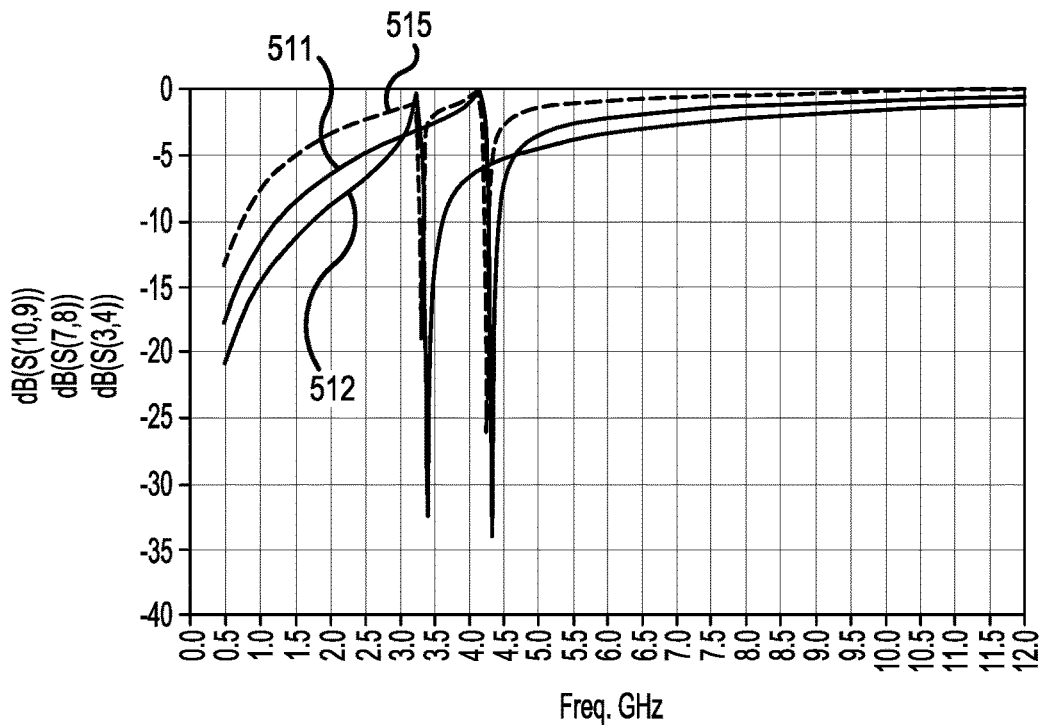
FIG. 5 is a graph showing insertion loss of a filter including notch filters connected in parallel with no phase shifter, and insertion loss for the individual notch filters, for purposes of comparison.
Figure 6:
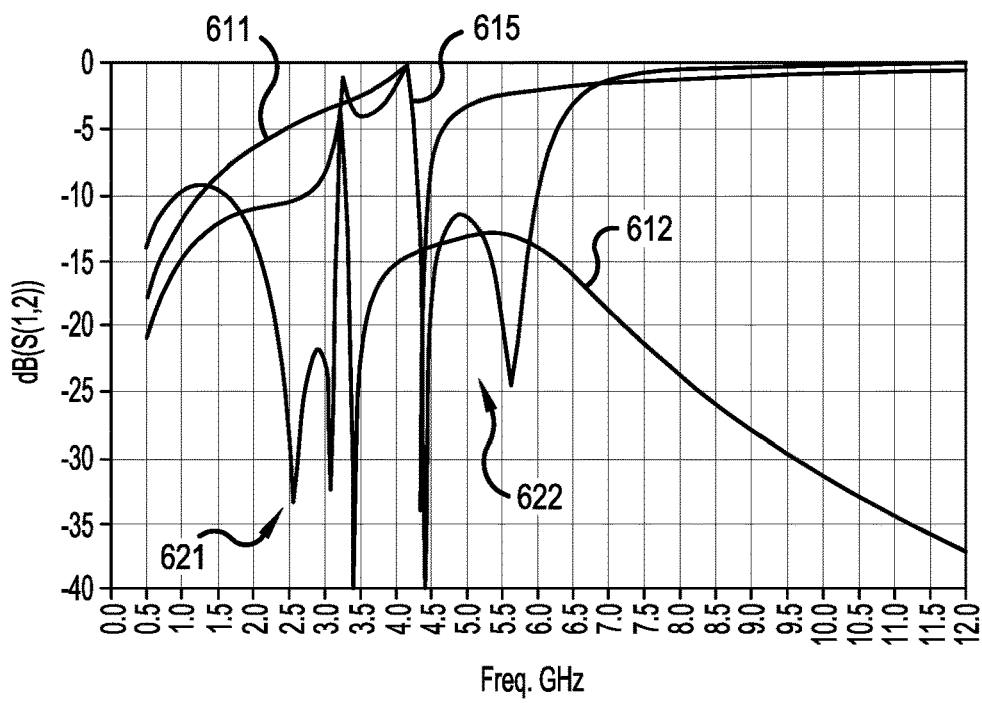
FIG. 6 is a graph showing insertion loss of a bandpass filter including notch filters and a phase shifter, according to a representative embodiment, and insertion loss for the individual first and second filter circuits, for purposes of comparison.

FIG. 5 is a graph showing insertion loss of an illustrative filter including notch filters connected in parallel, and no phase shifter, and insertion loss of the individual notch filters forming the filter, for purposes of comparison. FIG. 6 is a graph showing insertion loss of a bandpass filter including notch filters and a phase shifter, according to a representative embodiment, and insertion loss of the individual first and second filter circuits, for purposes of comparison.

Referring to FIG. 5, trace 511 shows insertion loss of a first notch filter, and trace 512 shows insertion loss of a second notch filter. As can be seen, the first notch filter provides a notch (stop condition) at about 4.3 GHz and the second notch filter provides a second notch (stop condition) at about 3.3 GHz. Trace 515 in FIG. 5 shows insertion loss of a conventional band pass filter that includes the first and second notch filters, connected in parallel, corresponding to the traces 511 and 512. As shown by the trace 515, the band pass filter provides low insertion loss in the passband, e.g., from about 3.3 GHz to about 4.3 GHz. Although there is high insertion loss at the lower and upper cutoff frequencies of the passband, the insertion loss does not remain high below and above the lower and upper cutoff frequencies, respectively, so the band pass filter does not block RF signals at frequencies immediately outside the passband. That is, in the adjacent frequency bands, the band pass filter has low insertion loss (e.g., above −5 dB), enabling RF signals at frequencies below and above the lower and upper cutoff frequencies to pass.

Referring to FIG. 6, trace 611 shows insertion loss of a first notch filter circuit (e.g., first filter circuit 410), and trace 612 shows insertion loss of a second notch filter circuit (e.g., second filter circuit 420), according to a representative embodiment. As can be seen, the first filter circuit 410 provides a notch (stop condition) at about 4.3 GHz and the second filter circuit 420 provides a second notch (stop condition) at about 3.3 GHz.

Trace 615 in FIG. 6 shows insertion loss of the band pass filter (e.g., band pass filter 400) that includes the first and second notch filter circuits 410 and 420, connected in parallel (as discussed above), corresponding to the traces 611 and 612, respectively. As shown by the trace 615, the band pass filter provides low insertion loss in the passband, e.g., from about 3.3 GHz to about 4.3 GHz. There is high insertion loss at the lower and upper cutoff frequencies of the passband, and further, the insertion loss continues to be high (e.g., greater than at least about −10 dB) at frequencies below and above the lower and upper cutoff frequencies, respectively, so that the band pass filter continues to block RF signals at frequencies immediately outside the passband. That is, in the adjacent lower and upper stopbands 621 and 622, the band pass filter has high insertion loss (e.g., above −10 dB), thereby blocking RF signals at frequencies below and above the lower and upper cutoff frequencies. Also, the roll-off at each of the lower and upper cutoff frequencies is steep, so that the passband does not extend into neighboring frequency bands.

Figure 7B:
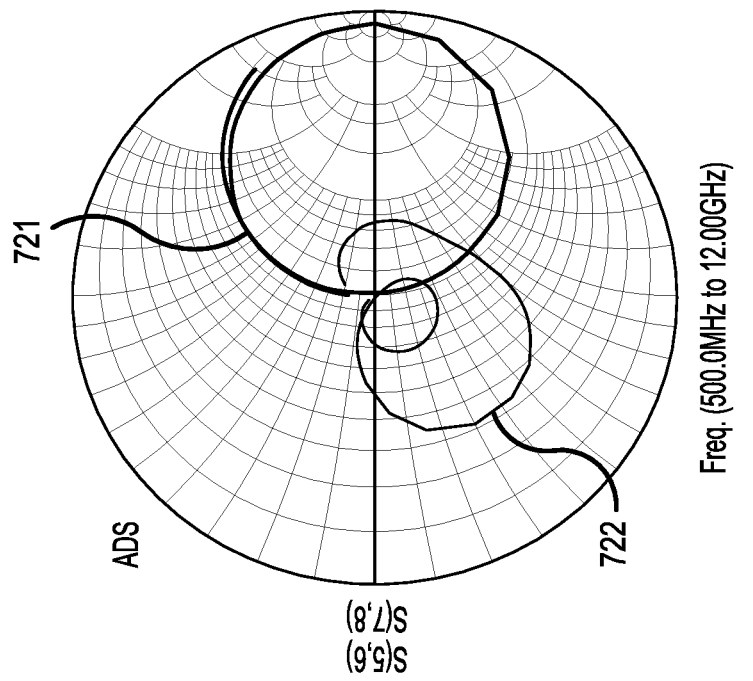
FIG. 7B is a Smith chart showing impedance of the first and second filter circuits of the band pass filter shown in FIG. 4, for example, from 500 MHz to 12 GHz, according to a representative embodiment.
Figure 7A:
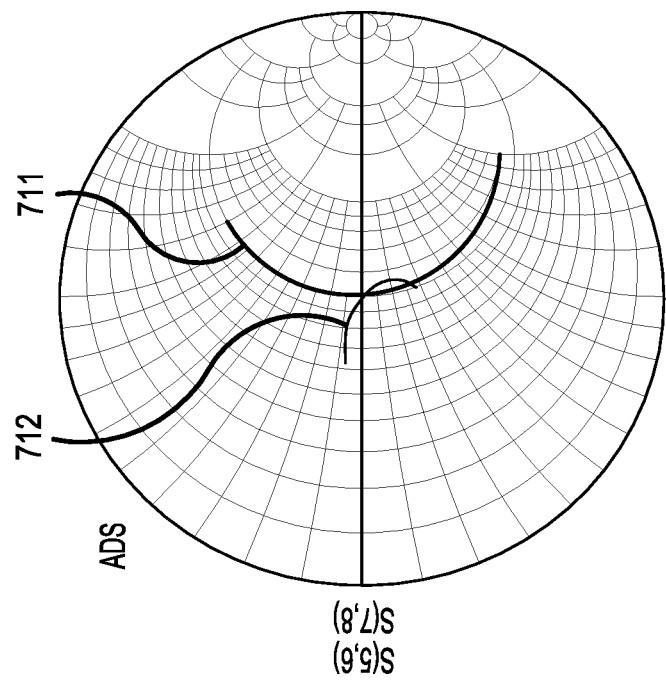
FIG. 7A is a Smith chart showing impedance of the first and second filter circuits of the band pass filter shown in FIG. 4, for example, from 3.3 GHz to 4.2 GHz, according to a representative embodiment.

FIG. 7A is a Smith chart showing impedance of the first and second filter circuits of the band pass filter shown in FIG. 4, for example, from 3.3 GHz to 4.2 GHz (band n77), according to a representative embodiment. FIG. 7B is a Smith chart showing impedance of the first and second filter circuits of the band pass filter shown in FIG. 4, for example, from 500 MHz to 12 GHz, according to a representative embodiment.

Referring to FIG. 7A, trace 711 shows impedance of the first filter circuit 410 and trace 712 shows impedance of the second filter circuit 420 in the band pass filter 400 of RF signals at frequencies from 3.3 GHz to 4.2 GHz. As shown by traces 711 and 712, both curves intersect the unit circle and the upper and lower corners of the filter, e.g., as shown by the trace 615 in FIG. 6.

Referring to FIG. 7B, trace 721 shows impedance of the first filter circuit 410 and trace 722 shows impedance of the second filter circuit 420 of RF signals at frequencies from 500 MHz to 12.0 GHz. As shown by traces 721 and 722, the phases of, e.g., the first filter circuit 410 and the second filter circuit 420 add up in the passband, and effectively cancel out each other outside the passband, thus forming stopbands of the filter. The effective cancellation occurs along all of the lower stopband, and attenuation is maintained on the upper stopband until about 6.5 GHz.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A filter device providing a passband of a communication device for a radio frequency (RF) signal having a frequency greater than 3 GHz, the filter device comprising:
   a first filter circuit comprising a first notch filter, the first filter circuit having a first notch; and
   a second filter circuit connected in parallel with the first filter circuit, the second filter circuit comprising a second notch filter and a reversal circuit, connected in series with the second notch filter, for phase shifting the RF signal filtered by the second notch filter, the second filter circuit having a second notch, wherein the first filter circuit and the second filter circuit form a band pass filter having a passband between a lower cutoff frequency defined by the second notch and an upper cutoff frequency defined by the first notch, an adjacent lower stopband below the lower cutoff frequency of the passband, and an adjacent upper stopband above the upper cutoff frequency of the passband,
   wherein the band pass filter provides a first insertion loss in the passband, a second insertion loss in the adjacent lower stopband, and a third insertion loss in the adjacent upper stopband, wherein the first insertion loss is less than each of the second insertion loss and the third insertion loss, and
   wherein the adjacent lower stopband and the adjacent higher stopband are formed based on subtracting a first filter response of the first notch filter circuit by a second filter response of the second filter circuit.

2. The filter device of claim 1, wherein the first notch filter comprises a first acoustic resonator, and the second notch filter comprises a second acoustic resonator.

3. The filter device of claim 2, wherein each of the first acoustic resonator and
the second acoustic resonator comprises one of a bulk acoustic wave (BAW) resonator, a thin-film bulk acoustic resonator (FBAR), a solid mounted resonator (SMR), or a surface acoustic wave (SAW) resonator.

4. The filter device of claim 2, wherein:
at frequencies below a second series resonance frequency of the second acoustic resonator, the first filter response of the first notch filter is subtracted by the second filter response of the phase shifted RF signal of the reversal circuit, forming the adjacent lower stopband of the band pass filter below the second series resonance frequency of the second acoustic resonator,
at frequencies between the second series resonance frequency of the second acoustic resonator and a first series resonance frequency of the first acoustic resonator, the first filter response of the first notch filter adds with the second filter response of the second notch filter, forming the passband of the band pass filter, and
at frequencies above the first series resonance frequency, the first filter response of the first notch filter is subtracted by the second filter response of the reversal circuit, forming the adjacent upper stopband of the band pass filter above the first series resonance frequency of the first acoustic resonator.

5. The filter device of claim 1, wherein the reversal circuit comprises an inductor/capacitor (LC) circuit.

6. The filter device of claim 5, wherein the LC circuit comprises a first inductance and a second inductance connected in series with the second notch filter, and a capacitance connected between ground and a node located between the first and second inductances.

7. The filter device of claim 1, wherein the reversal circuit comprises a transmission line.

8. The filter device of claim 1, wherein each of the first notch filter and the second notch filter comprises one of a series LC circuit, an LC resonator, or an open transmission line to a transmission trap.

9. The filter device of claim 1, wherein the reversal circuit phase shifts the RF signal filtered by the second notch filter by about 180 degrees.

10. The filter device of claim 1, wherein each of the second and third insertion loss is greater than at least −10 dB.

11. The filter device of claim 1, wherein the passband corresponds to a predetermined frequency band standard for telecommunication devices, and at least one of the adjacent lower stopband and the adjacent upper stopband corresponds to another predetermined frequency band standard of telecommunication devices.

12. A band pass filter for a radio frequency (RF) signal having a frequency greater than 3 GHz, the band pass filter comprising:
a first notch filter circuit comprising a first notch filter having a first notch; and
a phase shifting filter circuit connected in parallel with the first notch filter circuit, the phase shifting circuit comprising a second notch filter having a second notch and a phase shifter connected in series with the second notch filter and configured to shift a phase of the RF signal about 180 degrees to provide a reversed phase of the RF signal,
wherein the first notch and the phase-shifted second notch form a passband of the band pass filter based on subtracting a first output of the first notch filter circuit by a second output of the phase shifting filter circuit.

13. The band pass filter of claim 12, wherein the passband is formed between a lower cutoff frequency defined by the phase-shifted second notch and an upper cutoff frequency defined by the first notch.

14. The band pass filter of claim 13, wherein a first insertion loss is provided in the passband, a second insertion loss is provided in an adjacent lower stopband below the lower cutoff frequency of the passband, and a third insertion loss is provided in an adjacent upper stopband above the upper cutoff frequency of the passband, wherein the first insertion loss is less than each of the second and third insertion loss.

15. The band pass filter of claim 12, wherein the first notch filter comprises a first resonator having a first series resonance frequency, and the second notch filter comprises a second resonator having a second series resonance frequency.

16. The band pass filter of claim 15, wherein:
at frequencies below the second series resonance frequency, filter response of the first notch filter is subtracted by a response of the reversed phase of the phase shifting filter circuit, forming an adjacent lower stopband of the band pass filter below the second series resonance frequency,
at frequencies between the second series resonance frequency of the second resonator and the first series resonance frequency of the first resonator, the filter response of the first notch filter adds with a filter response of the second notch filter, forming the passband of the band pass filter, and
at frequencies above the first series resonance frequency, the filter response of the first notch filter is subtracted by the response of the reversed phase of the phase shifting filter circuit, forming an adjacent upper stopband of the band pass filter above the first series resonance frequency.

17. The band pass filter of claim 12, wherein the phase shifter comprises an inductor/capacitor (LC) circuit.

18. The band pass filter of claim 12, wherein the phase shifter comprises a transmission line.

19. A band pass filter, comprising:
a first filter circuit comprising a first notch filter, the first filter circuit having a first notch;
a second filter circuit connected in parallel with the first filter circuit, the second filter circuit comprising a second notch filter and a reversal circuit configured to phase shift an output of the second notch filter, the second filter circuit having a second notch; and
a passband formed between a lower cutoff frequency defined by the second notch and an upper cutoff frequency defined by the first notch,
wherein an adjacent lower stopband is formed below the lower cutoff frequency of the passband, and an adjacent upper stopband is formed above the upper cutoff frequency of the passband, and wherein the adjacent lower stopband and the adjacent higher stopband are formed based on subtracting a first filter response of the first filter circuit with a second filter response of the second filter circuit.

20. The band pass filter of claim 19, wherein the first notch filter comprises a first acoustic resonator, and the second notch filter comprises a second acoustic resonator, and wherein the reversal circuit comprises an inductor/capacitor (LC) circuit.

\* \* \* \* \*